(12) United States Patent
Imamiya

(10) Patent No.: US 6,407,628 B2
(45) Date of Patent: Jun. 18, 2002

(54) POTENTIAL CHANGE SUPPRESSING CIRCUIT

(75) Inventor: Kenichi Imamiya, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/725,726

(22) Filed: Nov. 30, 2000

(30) Foreign Application Priority Data

Dec. 1, 1999 (JP) ............................................ 11-342357

(51) Int. Cl.[7] .............................................. H03K 17/10
(52) U.S. Cl. ........................ 327/589; 327/390; 327/534
(58) Field of Search ................................. 327/589, 309, 327/310, 546, 536, 390, 534

(56) References Cited

U.S. PATENT DOCUMENTS 4,905,314 A * 2/1990 Kato et al. ................... 327/589
5,812,001 A 9/1998 Imamiya ...................... 327/198
6,255,900 B1 * 7/2001 Chang et al. ................ 327/589

* cited by examiner

Primary Examiner—Dinh T. Le
(74) Attorney, Agent, or Firm—Banner & Witcoff, Ltd.

(57) ABSTRACT

To a first node at a boosted potential, a control circuit is connected for controlling a potential of the first node so that the potential of the first node does not exceed a predetermined potential, wherein the control circuit has a capacitor connected between the first node and a second node, a first switching transistor having a source-drain current path inserted between the second node and the ground node and a gate to which a control signal is input, and a second switching transistor having a source-drain current path inserted between the first node and the ground node, and a gate connected to the second node.

17 Claims, 4 Drawing Sheets

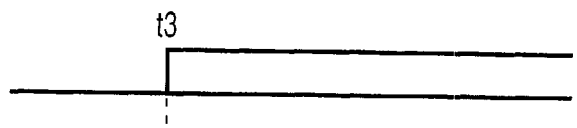
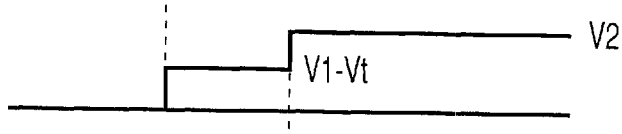
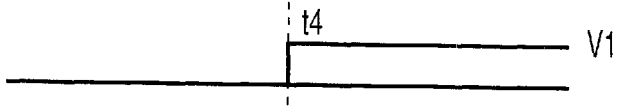
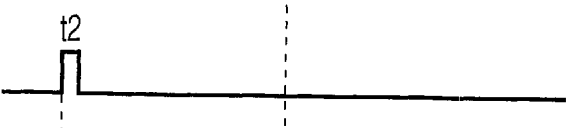
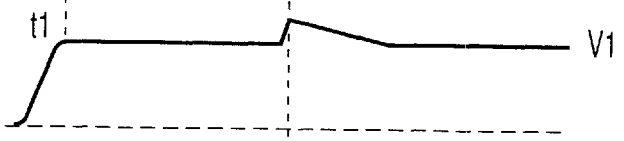
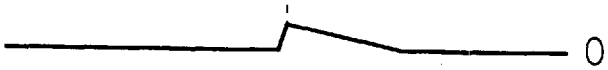
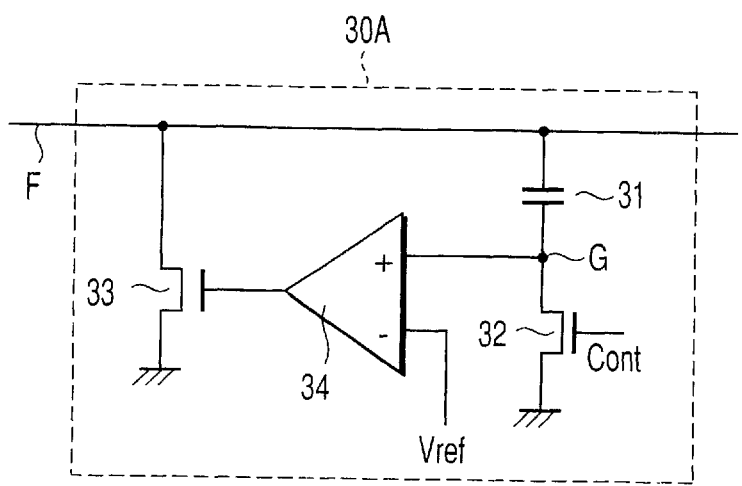

PRIOR ART  NODE C

PRIOR ART  NODE D

PRIOR ART  NODE A

PRIOR ART  NODE B

POTENTIAL CHANGE SUPPRESSING CIRCUIT

CROSS-REFERENCE TO RELATED APPLICATIONS

This application is based upon and claims the benefit of priority from the prior Japanese Patent Application No. 11-342357, Dec. 1, 1999, the entire contents of which are incorporated herein by reference.

BACKGROUND OF THE INVENTION

The present invention relates to a semiconductor integrated circuit provided with a circuit for limiting to a predetermined value or less a change in a potential which has been boosted from a power supply potential, and more particularly to a nonvolatile semiconductor memory integrated circuit or the like having a row decoder circuit for outputting the boosted potential to word lines.

In the nonvolatile semiconductor memory integrated circuit, it is necessary to apply the potential boosted to a level higher than the normal potential of the power supply at the time of writing or erasing data.

FIG. 5 is a circuit diagram showing an extracted part of a row decoder circuit and a prior art potential control circuit for outputting a potential boosted to a level higher than the normal power supply at the time of writing data in a conventional nonvolatile semiconductor memory integrated circuit.

In FIG. 5, a transistor 51 is provided at a final stage of the row decoder circuit, and the transistor 51 outputs the boosted potential to word line WL at the time of data writing. To node A to which one of the source or the drain of this transistor 51 is connected, a potential which is boosted at the time of driving the word line WL is supplied. A node B to which the other of the source and the drain of the transistor 51 is connected is connected to the corresponding word line WL. Furthermore, between a node C to which the boosted potential is supplied and a node D to which the gate of the transistor 51 is connected, the source-drain path of the transistor 52 is inserted. To a node E of the gate of the transistor 52, a predetermined bias potential is supplied.

Furthermore, between the node D and a node F to which the boosted potential is supplied, a potential limiting circuit 53 for limiting the potential at the node D to less than the predetermined value is inserted. This potential limiting circuit 53 comprises two transistors 54 and 55 in which a gate is connected to respective source and the source-drain paths are connected in series. In this case, the transistors 54 and 55 are of N-channel enhancement type.

Next, an operation of the circuit of FIG. 5 will be explained by referring to the timing chart of FIGS. 6A through 6D. Suppose that the boosted potential V1 is supplied to the node E of the gate of the transistor 52 at the time of data writing.

In the beginning, a boosted potential V1 is supplied to the node C at the time of data writing to the memory cell not shown connected to the word line WL. As shown in FIG. 6A, when the node C is set to the boosted potential V1, the transistor 52 is turned on. Then, as shown in FIG. 6B, the node D is charged to V1−Vt through this transistor 52 (where Vt denotes a threshold voltage of the transistor 52), and the transistor 52 is cut off.

Next, as shown in FIG. 6C, the potential of the node A is changed from the ground potential to the boosted potential V1. Since the transistor 52 has been cut off and the node D is in the floating state, the rise in the channel potential of the transistor 51 causes the rise in the potential of the node D from V1−Vt to V2 as shown in FIG. 6 by means of the coupling of the channel region in the transistor 51. When this potential V2 is higher than the value (V1+Vt) obtained by adding the threshold voltage Vt of the transistor 51 to the potential V1 of the node A, the transistor 51 is set to a sufficient ON state with the result that the boosted potential supplied to the node A is transmitted to the node B. As a result, as shown in FIG. 6D, the boosted potential V1 is supplied to the word line WL.

In this manner, it is required to sufficiently increase the potential of the node D which is the gate node of the transistor 51 in order to transmit the potential V1 which is boosted from the node A to the node B. However, when the potential of the node D becomes too high so that the potential of the node D exceeds a withstanding voltage of the transistor connected to this node D, for example, the transistor 52, the transistor 52 will be broken.

The potential limiting circuit 53 is provided to restrict the potential of the node D so as to prevent the potential of the node D from exceeding the withstanding voltage of the transistor 52. That is, when the potential of the node D becomes higher than the sum of the threshold voltages of the respective transistors 54 and 55, namely 2 Vt higher than the potential of the node F, the node D is discharged to the node F via a series connection circuit of the transistors 54 and 55 with the result that the potential of the node D is restricted so that the potential does not become a certain potential or more. Here, for example, when the potential of the node F is set to be equal to the potential V1 at the node A, the upper limit of the node D becomes V1+2 Vt.

By the way, in a circuit of FIG. 5, no problem arises when the potential V1 supplied to the node F has a sufficient current supply capability as can be seen in the power supply given from the outside of the chip, and the level is maintained stably. However, in the case where the potential V1 supplied to the node F is generated in the booster circuit or the like in the chip, the current supply capability is low. When the current is consumed with the operation of the other circuit, there is a possibility that the potential V1 at the node F is lowered to a level less than the predetermined value. This leads to the restriction of the potential of the node D to a level less than needed with the result that the potential of the node D does not attain the target value, and a boosted potential having a sufficient value can not be supplied to the word line WL.

In such a situation, conventionally, a circuit shown in FIG. 7 is provided. This circuit is constituted in such a manner that the potential generated in the booster circuit 76 in the chip is supplied to the node F of the potential limiting circuit 53 via a transistor 77 which is diode-connected. Incidentally, the potential generated in the booster circuit 76 is also supplied to the other circuit 78 in the same chip.

In this circuit arrangement, the current is consumed in another circuit 78. Since a gate of the transistor 77 is connected either to the source and the drain to form a diode-connection and the transistor 77 having a rectifying characteristic is connected between the booster circuit 76 and the node F, even when an output potential from the booster circuit 76 is lowered, the potential of the node F is not lowered.

By the way, as shown in FIG. 7, the capacity 71 is connected between the node F and the ground potential. This capacity 71 is provided for stabilizing the potential of the node F. When the potential limiting circuit 53 is operated, an excess charge at the node D is discharged toward the node F. No problem arises when the discharged charge is small as compared with the value of the capacity 71. Otherwise, since the node F is in the floating state, the node F rises to a level higher than the potential set with the output of the booster circuit 76. In this case, the charge of the node D is not discharged, and the intended effect of the potential limiting circuit 53 is lost.

Under these circumstances, it is considered that the value of the capacity 71 is enlarged. However, in the case where a plurality of potential limiting circuits 53 are connected to the node F, and these plurality of potential limiting circuits 53 are operated at the same time, the discharged charge quantity to the node F will become very large. Since it is necessary to make an attempt of increasing the capacity 71 along with the enlargement of the discharged charge quantity, a very large element area for the capacity 71 will be required. This leads to an increase in the chip area.

Then, in order to solve the above problem, furthermore, conventionally, a circuitry shown in FIG. 8 is provided. This circuitry is designed to divide the potential at the node F with a pair of resistors 81 and 82 connected in series between the node F and the ground potential, and compares the divided potential Vdiv with the reference potential Vref with a differential amplifier 83 so that an attempt is made to stabilize the potential at the node F by controlling the conduction of the transistor 84 connected between the node F and the ground potential on the basis of the result of the comparison at the amplifier 83.

That is, an excess increase in the potential of the node F is prevented by comparing the potential Vdiv divided with the pair of resistors 81 and 82 and the reference potential Vref by the differential amplifier 83 and discharging the charge of the node F through the transistor 84 when the potential of the node F becomes too high.

However, in this case, in the case where the boosted potential which is output from the booster circuit 76 is undesirably lowered, there arises a problem in that a charging path disappears for supplying a charge with respect to the node F so that the charge of the node F is undesirably discharged via the resistors 81 and 82, and the potential of the node F is lowered excessively.

The present invention has been made in view of the above circumstances. An object of the invention is to provide a potential change suppressing circuit which is capable of maintaining the boosted potential at a predetermined value at all times without increasing the chip area.

BRIEF SUMMARY OF THE INVENTION

According to a first aspect of the present invention, there is provided a potential change suppressing circuit comprising:

a capacitor connected between a first node and a second node;

a switch for connecting the first node to a first reference potential;

a potential setting circuit which sets the second node to a second reference potential; and a potential changing circuit which changes a potential of the second node in a direction opposite to a direction of a potential change in the second node in the case where the potential of the first node is changed by a predetermined value or more along with a change in the potential in the second node.

According to another aspect of the present invention, there is provided a potential change suppressing circuit comprising:

a capacitor connected between a first node and a second node;

a switch for connecting the first node to a first reference potential;

a potential setting circuit for setting the second node to a second reference voltage;

a potential change detecting circuit for detecting a potential change in the first node along with the change in the potential in the second node; and a potential changing circuit having one end connected to the second node for changing a potential of the second node in a direction opposite to a direction of a potential change at the second node on the basis of an output from the potential change detecting circuit in a case where the potential of the first node is changed by a predetermined value or more in the potential change detecting circuit.

According to still another aspect of the present invention, there is provided a potential change suppressing circuit comprising:

means for setting a first node to a first reference potential; and potential changing means for storing the first reference potential at the first node and changing the potential of the first node in a direction opposite to a shift of the potential in the case where the potential in the first node is shifted from the stored first reference potential.

According to still another aspect of the present invention, there is provided a potential change suppressing circuit comprising:

a first transistor where a word line drive voltage is supplied to one end of a current channel between a source and a drain, and the other end of the current channel between the source and the drain is connected to the word line;

a second transistor where a first potential is supplied to one end of the current channel between the source and the drain, a predetermined bias potential is supplied to the gate, and the other end of the current channel between the source and the drain is connected to the gate of the first transistor;

circuit means which is connected between the gate of the first transistor and the first node and which has a rectifying characteristic which allows current to flow from the gate of the first transistor only in a direction of the first node; and control means connected to the first node for discharging the first node to lower the potential of the first node in the case where the potential of the first node rises, the control means having, a capacity connected between the first node and the second node, switching means for connecting and controlling the second node to the first reference potential, and potential changing means for changing the potential of the first node in a direction opposite to the direction of the potential change in the first node in the case where the potential of the second node is changed by a predetermined value or more along with a change in the potential in the first node.

According to still another aspect of the present invention, there is provided a potential change suppressing circuit comprising:

a first transistor where a word line drive voltage is supplied to one end of a current channel between a source and a drain, and the other end of the current channel between the source and the drain is connected to the word line;

a second transistor where a first potential is supplied to one end of the current channel between the source and the drain, a predetermined bias potential is supplied to the gate, and the other end of the current channel between the source and the drain is connected to the gate of the first transistor;

circuit means which is connected between the gate of the first transistor and the first node and which has a rectifying characteristic which allows current to flow from the gate of the first transistor only in a direction of the first node; and control means connected to the first node for discharging the first node to lower the potential of the first node in the case where the potential of the first node rises, the control means having, a capacity connected between the first node and the second node;

switching means for connecting and controlling the second node to a first reference potential, potential change detecting means for detecting a change in the potential of the second node along with the change in the first node, and potential changing means having one end connected to the first node for changing the potential of the first node in a direction opposite to the direction of the potential change in the first node on the basis of an output from the potential change detecting means in the case where the potential of the first node is changed by a predetermined value or more in the potential change detecting means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A through 3G are timing charts showing one example of an operation of the circuit of FIG. 2.

FIG. 4 is a view showing a structure of a control circuit having a structure different from the structure shown in FIG. 2 according to a second embodiment of the present invention.

DETAILED DESCRIPTION OF THE INVENTION

Figure 1:
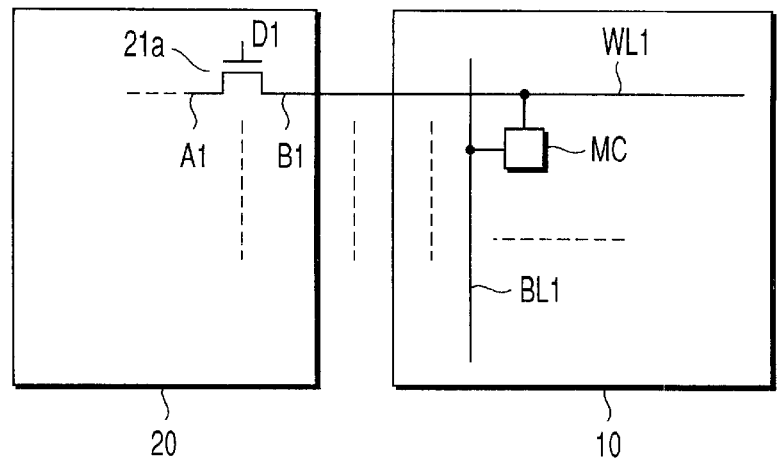
FIG. 1 is a block diagram showing a schematic structure of an essential portion in the case where the present invention is implemented in the nonvolatile semiconductor memory integrated circuit.

Embodiments of the present invention will be explained in detail by referring to the drawings hereinafter.

FIG. 1 is a block diagram showing a conceptual structure of an essential portion of a nonvolatile semiconductor memory integrated circuit, according to a first embodiment of the present invention.

Inside of a memory cell array 10, a plurality of word lines WL and bit lines BL (only WL1 and BL1 are shown respectively in the figure) are provided in a crossing manner. At cross points of the word lines WL1 and the bit lines BL1, memory cells MC comprising a nonvolatile transistor is arranged and connected between the corresponding word line and bit line.

A row decoder 20 is provided to selectively drive the word line WL1 corresponding to the address at the time of reading data from the memory cell as well as at the time of writing data to the memory cell MC and at the time of erasing data therefrom. At the time of writing data into the memory cell, a plurality of transistors (only one transistor 21a is shown in FIG. 1) for outputting a boosted potential to the selected word line WL1 are provided in correspondence to each of the word lines.

That is, the boosted potential is supplied to the node A1 at the time of driving the word line WL1 to which one of the source and the drain of the transistor 21a is connected, and the corresponding word line WL1 is connected to the node B1 to which the other of the source and the drain thereof is connected.

In the circuit of FIG. 1, when the boosted potential is supplied to the node A1, the potential of the node D1 of the gate of the transistor 21a is boosted with the coupling through the channel region of the transistor 21a so that the transistor 21a is set to a sufficient ON state, and the boosted potential supplied to the node A1 is supplied to the corresponding word line WL1.

Figure 2:
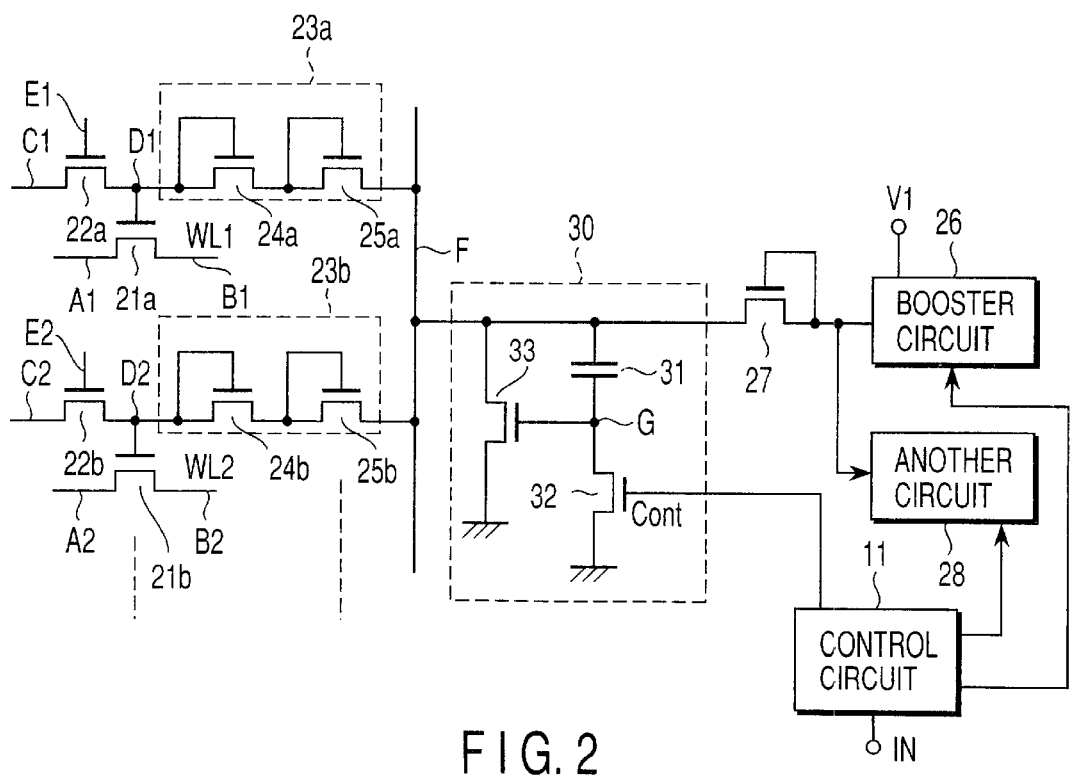
FIG. 2 is a circuit diagram showing an extracted portion of a row decoder control circuit and a plurality of transistors provided in the row decoder circuit of FIG. 1, according to a first embodiment of the present invention.
Figure 5:
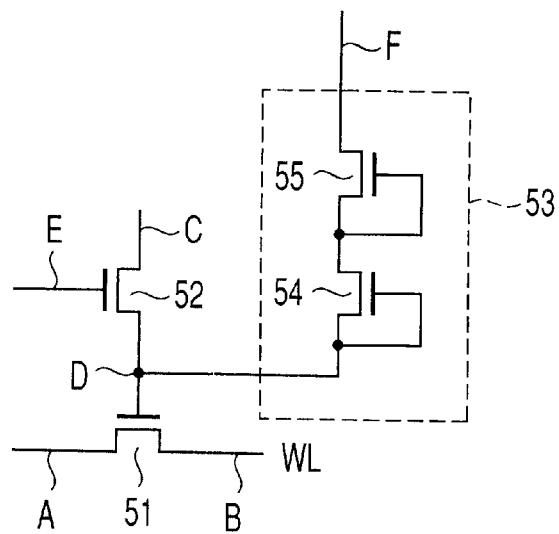
FIG. 5 is a circuit diagram showing an extracted portion of the row decoder circuit and a control circuit in the conventional nonvolatile semiconductor memory integrated circuit.
Figure 6A:
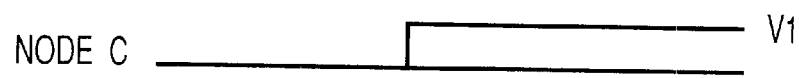
FIGS. 6A through 6D are timing charts showing an operation of the circuit of FIG. 5.
Figure 6B:
Figure 6C:
Figure 6D:
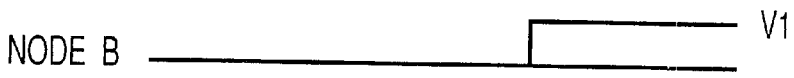
Figure 7:
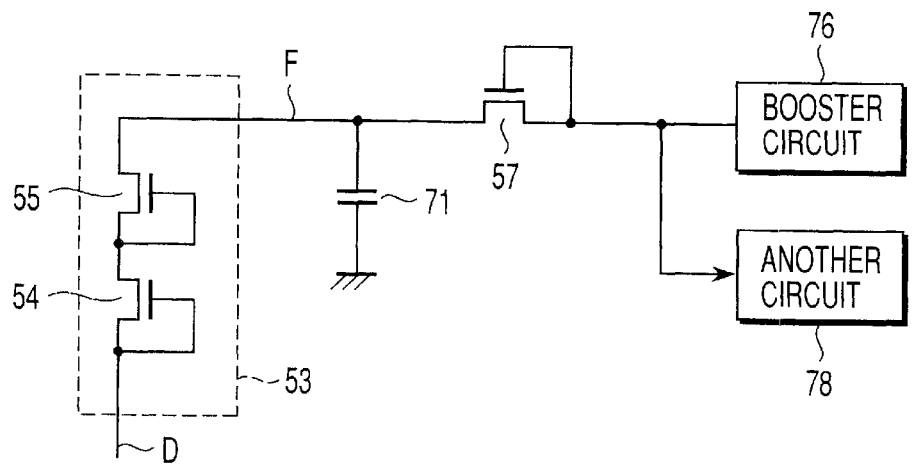
FIG. 7 is a circuit diagram showing a portion of the conventional nonvolatile semiconductor memory integrated circuit.
Figure 8:
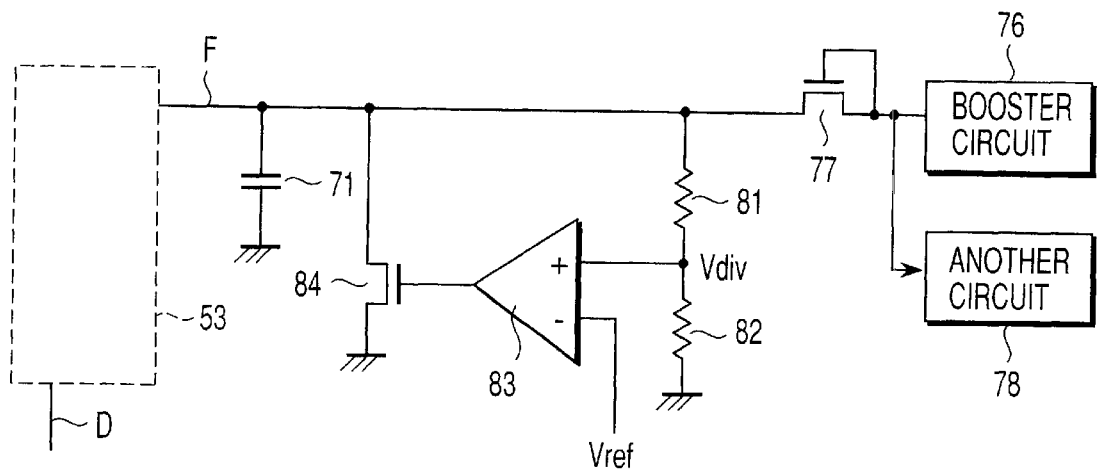
FIG. 8 is a circuit diagram showing an extracted portion of the conventional nonvolatile semiconductor memory circuit.

FIG. 2 is a circuit diagram showing an extracted portion of the row decoder circuit 20 in which a plurality of transistors (here, only two transistors 21a and 21b are shown) are provided, and a control circuit for the row decoder circuit 20.

A source-drain path of each of the transistors 22a and 22b is inserted between each of the nodes C1 and C2 to which the potential V1 boosted at the booster circuit 26 is supplied from the power supply voltage supplied from the outside and the nodes D1, D2 of the gates of each of the transistors 21a and 21b. Furthermore, a predetermined bias potential is supplied to the nodes E1 and E2 at the gate of each of the transistors 22a and 22b, respectively.

Potential limiting circuits 23a and 23b are inserted respectively between each of the nodes D1 and D2 and the node F to which the boosted potential is supplied for limiting the potential at each of the nodes D1 and D2 so that the potential at the node D1 or D2 does not become the predetermined value or more. Each of these potential limiting circuits 23a and 23b comprises two transistors 24a, 25a and 24b, 25b, in which, the source-drain paths of the two transistors are connected in series.

Here, for example, each of the gates of each of the two transistors 24a and 25a in the potential limiting circuit 23a is connected either to the source or the drain of each of the transistors 24a and 25a arranged on the side close to the node D1, in a diode-connection fashion. Each of these transistors 24a and 25a has a rectifying characteristic which allows a current to flow from the side of the node D1 to only the side of the node F, so that the potential limiting circuit 23a has a rectifying characteristic which allows current to flow from the side of the node D1 to only the side of the node F. Another potential limiting circuit 23b is constituted in the same manner in which two diode-connected transistors 24b and 25b are connected in series between the nodes D2 and F, the transistor 21b having a gate connected to the node D2 is connected between the nodes A2 and B2 to which the word line WL2 is connected, and a transistor 22b is connected between the nodes C2 and D2.

Furthermore, a booster circuit 26 is provided in a semiconductor integrated circuit constituted inside of the same chip. The boosted potential generated in this booster circuit 26 is supplied to the node F and, at the same time, is supplied to another circuit 28 in the same chip. The boosted potential is supplied to the node F via a transistor 27 which has a diode-connection. Here, the gate of the transistor 27 is connected to the source or the drain of the transistor 27 on the side of the node F opposite to the output node of the booster circuit 26, and this transistor 27 has a rectifying characteristic which allows current to flow from the side of the output node of the booster circuit 26 to only the side of the node F.

Furthermore, to the node F, a potential change control circuit 30 is connected for controlling the potential of the node F so that the potential thereof does not exceed a predetermined potential.

The potential change control circuit 30 comprises a capacitor 31 connected between the node F and the node G, a transistor 32 having a source-drain path connected between the node G and the node of the ground potential and a gate to which a control signal Cont from a control circuit 11 is supplied, and a transistor 33 having a source-drain path connected between the node F and the node of the ground potential and a gate connected to the node G.

Incidentally, in the circuit of FIG. 2, the control circuit 11 is constituted with a microprocessor, for example, for controlling an operation of the whole semiconductor integrated circuit including the memory cell array 10 and the row decoder 20 formed on the chip, and further outputting a signal for controlling an operation of the booster circuit 26 and another circuit 28. Furthermore, the transistor shown in FIG. 2 is all of N-channel enhancement type.

Now, an operation of the circuit of FIG. 2 formed in the mentioned structure will be explained by referring to the timing chart of FIGS. 3A through 3G. Incidentally, in the following explanation, the boosted potential V1 is constantly supplied, for example, from the booster circuit 26 to the node E at the gates of the transistors 22a and 22b at the time of data writing operation.

Assuming that the data is being written to the memory cell MC connected to the word line WL1 shown in FIG. 1.

As shown in FIG. 3A, the boosted potential V1 is supplied to the node C1 connected to the corresponding transistor 22a of FIG. 2 at the time t3. When this node C1 becomes at the boosted potential V1, the transistor 22a is turned on. As shown in FIG. 3B, the node D1 is charged to V1−Vt (Vt denotes the threshold voltage of the transistor 22a) through this transistor 22a. Then, the transistor 22a is cut off.

Next, as shown in FIG. 3C, the potential of the node A1 changes from the ground potential to the boosted potential V1 at the time t4 with a row address signal from the row decoder 20 of FIG. 1 formed in accordance with the writing signal. Then, as shown in FIG. 3B, the node D1 is set in the floating state because the transistor 22a is cut off, and the potential of the node D1 rises from V1−Vt to reach V2 with the coupling through the channel region of the transistor 21a along with the rise in the channel potential of the transistor 21a.

At this time, when the potential of the node F is sufficiently high, and the potential V2 of the node D1 is higher than the potential V1 of the node A1 by the threshold value of the transistor 21a or more, the transistor 21a is set to a sufficient ON state. As shown in FIG. 3D, the boosted potential V1 supplied to the node A1 is transmitted to the node B1 as it is. Then, the boosted potential V1 is transmitted to the corresponding word line WL1 so that data is favorably written on the memory cell MC.

On the other hand, by operating the booster circuit 26, the node F is charged with the boosted potential output from the booster circuit 26 via the diode-connected transistor 27. As explained before, the potential of the node F is set to a sufficiently high level. Furthermore, at the time of writing data, as shown in FIG. 3E, the control signal Cont supplied from the control circuit 11 to the gate of the transistor 32 at the time t2 in advance is set to an H level only for a short time. At this time, the transistor 32 is turned on. The node G is set to the ground potential by the turning on of this transistor 32, so that the potential at the time t2 in the node F is stored in the capacitor 31 which functions as a potential memory element. After that, the control signal Cont is brought back to the L level until the booster potential V1 is supplied to the node C1 at the time t3 and the transistor 32 is turned off.

Incidentally, as shown in FIG. 3F, the potential of the node F is set in such a manner that the potential is supplied via the transistor 27 from the booster circuit 26 so that the potential rises to V1 up to the time t1 prior to time t2.

In this state, as shown in FIG. 3C, when the booster potential V1 is supplied to the node A1 at time t4, the potential of the node D1 is boosted to V2 as has been explained in FIG. 3B before. Then, when the potential of the node D1 is set to be higher than the potential of the node F by the threshold voltage (2 Vt) corresponding to two transistors 24a and 25a in the potential limiting circuit 23a, the charge of the node D1 is discharged to the node F via potential limiting circuit 23a.

When the discharged charge quantity at this time increases, the potential of the node F further rises beyond V1 at the time t4 as shown in FIG. 3F. When the potential of the node F rises, the potential of the node G in the control circuit 30 rises from the ground potential "0" as shown in FIG. 3G with the coupling by the capacity 31 inside of the potential change control circuit 30. When the potential of the node G exceeds the threshold voltage of the transistor 33 inside of the control circuit 30, the transistor 33 is turned on, and the charge of the node F is discharged toward the ground potential via the transistor 33, so that the potential of the node F which is once boosted falls as shown in FIG. 3F. Then, when the potential of the node F is brought back to the original potential V1, the potential of the node G is also brought back to the original ground potential so that the transistor 33 is turned off, and discharge by the transistor 33 is suspended.

Consequently, a conduction control signal of the transistor 32 output from the control circuit 11 for storing the potential of the node F may be any one within the period from the time t1 when the potential of the node F has risen to the normal potential V1 up to time t4 when a high voltage V1 for writing is supplied to the node A1 with a row address signal. Such operation is the same as that of the other word lines including the word line WL2.

In this manner, in the nonvolatile semiconductor memory integrated circuit according to the above embodiment, the potential of the gate node D1 of the transistor 21a for transmitting the potential boosted, for example, with respect to the word line WL1 becomes too high with the result that even if the potential of the node F becomes too high with the charging of the node F via the potential limiting circuit 23a, the potential at the node F can be brought back to the suitable potential with the control circuit 30.

Furthermore, even if the consumption current increases in another circuit 28 to which the boosted potential V1 generated in the booster circuit 26 is supplied, and even if the boosted potential V1 which is generated in the booster circuit 26 is temporarily lowered to a level lower than the potential of the node F, there is no problem that the potential of the node F is not lowered because the flow of the current from the side of the node F to the side of the output node of the booster circuit 26 is prevented by the transistor 27 having a rectifying characteristic which allows current to flow to only the side of the node F from the output node side of the booster circuit 26.

Furthermore, in a period in which the potential of the node F is stabilized at a predetermined level, no current channel exists where the current flows from the node F to the ground potential in the control circuit 30. Thus, the charge of the node F is not discharged to the ground potential with the result that the potential of the node F is not lowered.

Furthermore, the capacitor 31 provided in the control circuit 30 may only have a function of storing the potential at the node F so that the area of the capacitor 31 and that of the control circuit 30 are not so necessary because so large a capacity is not required with the result that there is no problem that the chip area increases.

Next, an essential portion of the second embodiment of the present invention will be explained. FIG. 4 is a view showing a potential change control circuit 30A having a structure different from the structure shown in FIG. 2. The potential change control circuit 30A shown in FIG. 4 is different from the control circuit 30 in FIG. 2 in that the differential amplifier 34 is newly provided between the node G and the gate of the transistor 33, the node G is connected to the non-inversion input terminal of the differential amplifier 34, the reference potential Vref is supplied to the inversion input terminal of the differential amplifier 34, and the output terminal of the differential amplifier 34 is connected to the gate of the transistor 33. The structure of other portions of the control circuit 30A is the same as the structure including the circuit 30 of FIG. 2.

In the control circuit 30A having such a structure, the potential of the node F is stored in the capacitor 31 when the transistor 32 is turned on with the signal Cont from the control circuit 11. The transistor 32 is immediately turned off after the potential at the node F is stored.

Then, when the potential of the node F rises, and the potential of the node G rises along with it so that the potential of the node G exceeds the reference potential Vref, an output signal of the differential amplifier 34 becomes an H level, and the transistor 33 is turned on with the result that a charge of the node F is discharged to the ground potential and the rise in the potential of the node F is suppressed.

That is, the same advantage as the first embodiment can be obtained in this second embodiment as well.

Incidentally, the present invention is not restricted to each of the above embodiments, and various modification can be made. For example, in each of the above-mentioned two embodiments, two transistors 24a, 24b and 25a, 25b, . . . are connected in series in each of the potential limiting circuits 23a, 23b, . . . However, the potential limiting circuits may be constructed only by one transistor, or may be constructed by three or more transistors connected in series.

Furthermore, in the embodiment shown in FIG. 2, an explanation thereof is made on the assumption that all the transistors are of N-channel type. The invention can be implemented by forming all the transistors in P-channel type, setting the potential of the node F to minus (−) V1 so that the transistor 33 is allowed to conduct charges to boost the potential of the node F toward the ground potential by the predetermined value when the potential difference between the ground potential and the node F becomes too large.

As has been explained, according to the present invention, there is provided a semiconductor integrated circuit which is capable of maintaining the boosted potential at a predetermined value without increasing the chip area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A potential change suppressing circuit comprising:
    an input terminal connected to a first node of a first potential to be controlled;
    a capacitor connected between the first node and a second node;
    a switch connected between the second node and a reference potential;
    a switch controller configured to turn on said switch temporarily causing said capacitor to store the first potential to be controlled, and to set the second node at a floating state after the second node is set at the reference potential; and
    a potential control circuit connected to the first node to control a second potential at the first node to change back to the first potential in response to a potential change at the second node, when a potential of the second node coupled to the first node via said capacitor is changed by a predetermined value or more along with a change in the second potential at the first node from the first potential.

2. The potential change suppressing circuit according to claim 1, wherein said potential control circuit comprises a first transistor having a source, a drain and a gate to form a current path between the source and drain, a first end of the current path being connected to the first node and a second end being connected to the reference potential, and the gate being connected to the second node.

3. The potential change suppressing circuit according to claim 1, further comprising a potential setting circuit connected to the first node to set the first node at the first potential, said potential setting circuit comprising an element having a rectifying characteristic that allows a current to flow from a potential source of the first potential to the first node.

4. The potential change suppressing circuit according to claim 1, wherein the first node is connected to a third node via an element having a rectifying characteristic which allows a current to flow from the third node to the first node.

5. A potential change suppressing circuit comprising:
   an input terminal connected to a first node of a first potential to be controlled;
   a capacitor connected between the first node and a second node;
   a switching circuit connected between the second node and a reference potential;
   a switch controller configured to turn on said switching circuit temporarily causing said capacitor to store the first potential to be controlled, and to set the second node at a floating state after the second node is set at the reference potential;
   a potential setting circuit configured to set the first node to the first potential;
   a potential change detecting circuit which detects a potential change in the second node along with a potential change in the first node via coupling between the first and second nodes by said capacitor; and
   a potential control circuit having a first end connected to the first node, a second end connected to the reference potential and a potential control terminal connected to an output of said potential change detecting circuit for changing a second potential of the first node back to the first potential according to the output from said potential change detecting circuit when a potential of the second node is changed by a predetermined value or more in said potential change detecting circuit.

6. The potential change suppressing circuit according to claim 5, wherein said potential change detecting circuit comprises a differential amplifier having first and second input terminals and an output terminal, the output terminal is connected to the potential control terminal, and the potential of the second node and a second reference potential are applied to the first and second input terminals of the differential amplifier, respectively.

7. The potential change suppressing circuit according to claim 6, wherein said potential control circuit comprises a transistor having a source, a drain and a gate, in which the source and drain form a current path a first end of which is connected to the first node and a second end is connected to the first reference potential, and the gate is connected to the output terminal of the differential amplifier.

8. The potential change suppressing circuit according to claim 5, wherein said potential setting circuit comprises an element having a rectifying characteristic that allows a current to flow to the first node from a potential source.

9. The potential change suppressing circuit according to claim 5, wherein the first node is connected to a third node via an element having a rectifying characteristic that allows a current to flow from the third node to the first node.

10. A potential change suppressing circuit comprising:
    an input terminal connected to a first node of a first potential to be controlled;
    a storing circuit configured to store the first potential at the first node;
    a potential change detecting circuit configured to detect a potential change different from the first potential stored by said storing circuit at the first node; and
    a potential changing circuit configured to change a second potential of the first node back to the first potential when the potential change different from the first potential at the first node is detected by said potential detecting circuit.

11. A potential change suppressing circuit comprising:
    an input terminal connected to a first node of a first potential to be controlled;
    a potential limiting circuit connected between the first node and a second node, the potential limiting circuit having a rectifying characteristic which allows a current to flow from the second node to the first node;
    a first transistor having a gate connected to the second node, a source and a drain to form a first current path between the source and the drain, wherein a word line drive voltage is supplied to a first end of the first current path, and a second end of the first current path is connected to a word line;
    a second transistor having a gate, a source and a drain to form a second current path between the source and drain, wherein the first potential is supplied to a first end of the second current path, a predetermined bias potential is supplied to the gate of the second transistor, and a second end of the second current path is connected to the gate of the first transistor which is connected to the second node;
    a rectifying circuit which is connected between the gate of the first transistor and the first node and which has a rectifying characteristic which allows a current to flow from the gate of the first transistor only in a direction of the first node; and
    a control circuit connected between the first node and a reference potential for discharging charges at the first node to the reference potential to bring back a second potential of the first node to the first potential when the second potential of the first node rises above the first potential,
    said control circuit having;
       a capacitor connected between the first node and a third node;
       a switch configured to connect and control the third node to the reference potential;
       a switch control circuit configured to temporarily turn on said switch causing the capacitor to store the first potential; and
       a potential changing circuit configured to change the second potential of the first node back to the first potential when a potential of the third node changes by a predetermined value or more along with a change in the second potential in the first node by coupling said capacitor between the first and third nodes.

12. The potential change suppressing circuit according to claim 11, wherein said potential changing circuit comprises a third transistor having a gate, a source and a drain to form a current path between the source and drain, wherein a first end of the current path is connected to the first node, and a second end is connected to the reference potential, and the gate is connected to the third node.

13. A potential change suppressing circuit comprising:
    an input terminal connected to a first node of a first potential to be controlled;
    a potential limiting circuit connected between the first node and a second node, said potential limiting circuit having a rectifying characteristic which allows a current to flow from the second node to the first node;
    a first transistor having a gate connected to the second node, a source and a drain to form a first current path between the source and drain, wherein a word line drive voltage is supplied to a first end of the first current path, and a second end of the current path is connected to a word line;

a second transistor having a gate, a source and a drain to form a second current path, wherein the first potential is supplied to a first end of the second current path, a predetermined bias potential is supplied to the gate, and a second end of the second current path is connected to the gate of the first transistor; and a control circuit connected between the first node and a reference potential for discharging charges at the first node to the reference potential to lower a second potential of the first node when the second potential of the first node rises above the first potential, said control circuit comprising;

a capacitor connected between the first node and a third node;

a switch configured to connect and control the third node to the reference potential;

a switch controller connected to the switching controller to turn on said switch temporarily for storing the first potential in said capacitor;

a potential change detecting circuit configured to detect a change in the second potential of the first node along with a potential change in the first node by coupling said capacitor between the first and third nodes; and a potential changing circuit having a first end connected to the first node and a second end connected to the reference potential configured to change the second potential of the first node back to the first potential according to an output from said potential change detecting circuit when the second potential of the first node is changed by a predetermined value or more by said potential change detecting circuit.

14. The potential change suppressing circuit according to claim 13, wherein said potential change detecting circuit comprises a differential amplifier having first and second input terminals and an output terminal, and the potential of the third node and the reference potential are supplied to the first and second input terminals, respectively, and the output terminal is connected to said potential changing circuit.

15. The potential change suppressing circuit according to claim 14, wherein said potential changing circuit comprises a third transistor having a gate and a current path, in which a first end of the current path is connected to the first node, a second end is connected to the reference potential, and the gate is connected to the output terminal of the differential amplifier.

16. A semiconductor integrated circuit comprising:

an input terminal connected to a first node of a potential to be controlled;

a potential memory element connected between the first node and a second node for storing the potential of the first node;

a switching circuit connected between the second node and a ground potential;

a switch controller connected to the switching circuit to turn on temporarily at a time of storing the potential of the first node by said potential memory element;

a potential setting circuit configured to set the first node to a predetermined reference potential; and a potential changing circuit configured to change the potential of the first node back to the predetermined reference potential when a potential of the second node changes to a predetermined value or more along with a potential change of the predetermined reference potential at the first node.

17. A semiconductor integrated circuit comprising:

a memory cell array for storing data with a selective driving of a word line and a bit line;

a column address control circuit for driving the word line in order to control a data memory operation of said memory cell array;

a first transistor having a first current path and a gate, where a word line drive voltage is supplied to a first end of the first current path, and a second end of the first current path is connected to the word line;

a second transistor having a second current path and a gate, where a first potential is supplied to a first end of the second current path, a predetermined bias potential is supplied to the gate, and a second end of the second current path is connected to the gate of said first transistor;

a rectifying circuit which is connected between the gate of the first transistor and a first node and which has a rectifying characteristic which allows a current to flow from the gate of the first transistor only in a direction to the first node; and a control circuit connected to the first node configured to discharge charges at the first node to lower a potential of the first node when the potential of the first node rises above a predetermined potential, the control circuit having;

an input terminal connected to the first node of the predetermined potential to be controlled;

a capacitor connected between the first node and a second node;

a switching circuit connected between the second node and a reference potential;

a switch controller connected to said switching circuit to turn on said switching circuit temporarily to store the predetermined potential at the first node in said capacitor;

a potential change detecting circuit configured to detect a change in a potential of the second node along with a potential change in the first node from the predetermined potential by coupling of said capacitor between the first and second nodes; and a potential changing circuit having a first end connected to the first node and a second end connected to the reference potential, said potential change detecting circuit configured to control the potential of the first node to change back to the predetermined potential according to an output from said potential change detecting circuit when the potential change of the second node is changed by a predetermined value or more in said potential change detecting circuit.

* * * * *